(12) United States Patent
Yang

(10) Patent No.: US 10,504,973 B2
(45) Date of Patent: Dec. 10, 2019

(54) OLED DISPLAY PANEL AND MANUFACTURING METHOD AND DISPLAY DEVICE THEREOF

(71) Applicant: Wuhan China Star Optoelectronics Technology Co., Ltd., Wuhan, Hubei (CN)

(72) Inventor: Jie Yang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 184 days.

(21) Appl. No.: 15/520,837

(22) PCT Filed: Mar. 20, 2017

(86) PCT No.: PCT/CN2017/077317
§ 371 (c)(1),
(2) Date: Apr. 20, 2017

(87) PCT Pub. No.: WO2018/157421
PCT Pub. Date: Sep. 7, 2018

(65) Prior Publication Data
US 2018/0301521 A1    Oct. 18, 2018

(30) Foreign Application Priority Data

Mar. 3, 2017    (CN) .......................... 2017 1 0124008

(51) Int. Cl.
*H01L 29/08*    (2006.01)
*H01L 27/32*    (2006.01)
(Continued)

(52) U.S. Cl.
CPC ...... *H01L 27/3246* (2013.01); *H01L 27/3211* (2013.01); *H01L 51/56* (2013.01); *H01L 51/001* (2013.01)

(58) Field of Classification Search
CPC . H01L 27/32; H01L 27/3246; H01L 27/3211; H01L 27/3244; H01L 27/3262
See application file for complete search history.

(56) References Cited

U.S. PATENT DOCUMENTS 9,559,155 B2 *   1/2017   Yang .................... H01L 27/322
9,899,532 B2 *   2/2018   Jiang .................... H01L 29/786
(Continued)

FOREIGN PATENT DOCUMENTS

CN          1868239 A      11/2006
CN        104659070 A       5/2015
CN        105895664 A       8/2016

*Primary Examiner* — Phuc T Dang
(74) *Attorney, Agent, or Firm* — Andrew C. Cheng

(57) ABSTRACT

The present disclosure provides an OLED display panel including a TFT array substrate and a plurality of anodes array arranged on the TFT array substrate, a pixel defining layer is covered on the TFT array substrate, the pixel defining layer includes an opening for exposing the anode and a spacer for spacing two adjacent ones of the anodes, a groove having an upper opening is arranged in the spacer, each of the openings corresponds to a sub-pixel area; wherein, a first common layer, a second common layer and a cathode layer are sequentially arranged on the pixel defining layer, the first common layer, the second common layer and the cathode layer are arranged with a light emitting material unit corresponding to each sub-pixel area. The present disclosure also discloses a method of manufacturing an OLED display panel as described above and a display device including the OLED display panel.

17 Claims, 3 Drawing Sheets

(51) Int. Cl.
*H01L 51/56* (2006.01)
*H01L 51/00* (2006.01)

(56) References Cited

U.S. PATENT DOCUMENTS

| | | | |
|---|---|---|---|
| 10,224,515 B2* | 3/2019 | Lim | H01L 51/5253 |
| 2009/0174320 A1* | 7/2009 | Kim | H01L 27/3246 |
| | | | 313/504 |
| 2011/0163331 A1* | 7/2011 | Yamazaki | H01L 27/3246 |
| | | | 257/88 |
| 2014/0361260 A1* | 12/2014 | Kim | H01L 27/3246 |
| | | | 257/40 |
| 2015/0001485 A1* | 1/2015 | Kang | H01L 51/0005 |
| | | | 257/40 |
| 2015/0194629 A1* | 7/2015 | Liu | H01L 51/56 |
| | | | 257/40 |
| 2016/0380035 A1 | 12/2016 | Cho | |
| 2017/0025485 A1* | 1/2017 | Kim | H01L 51/5237 |
| 2018/0170894 A1* | 6/2018 | Li | H01L 51/0061 |

\* cited by examiner

OLED DISPLAY PANEL AND MANUFACTURING METHOD AND DISPLAY DEVICE THEREOF

FIELD OF THE DISCLOSURE

The present disclosure relates to a display device technology field, and more particularly to an OLED display panel and a manufacturing method thereof, and also to a display device including the OLED display panel.

BACKGROUND OF THE DISCLOSURE

OLED (organic light emitting diode) display device with self-luminous, wide viewing angle, high luminous efficiency, low power consumption, fast response time, low temperature characteristics, simple manufacturing process, low cost. Flexible OLED display device with its light weight, flexible, easy to carry the advantages of wearable equipment to bring a far-reaching impact on the future of flexible OLED display device will continue to penetrate with the personal intelligence terminal to be more widely used.

The core component of the OLED display device is an OLED display panel, and the structure of the OLED display panel generally includes: a TFT array substrate, and an anode layer, a pixel definition layer, a first common layer, a light emitting layer, a second common layer, and a cathode layer sequentially fabricated on the TFT substrate. The anode layer includes a plurality of arrays of anodes arranged, the pixel defining layer includes a plurality of pixel openings corresponding to the anode one by one; the first common layer completely covers the pixel definition layer and the anode layer (in the structure layer for a continuous coverage), the first common layer may include a plurality of sub-functional layers; the light-emitting layer includes a plurality of light-emitting cells corresponding to the pixel openings, the light-emitting units being located within the pixel openings; the second common layer completely covers the light emitting layer and the first common layer (in the structure layer for a continuous coverage), the first common layer may include a plurality of sub-functional layers; the cathode layer overlaps the second common layer.

The OLED display panel works by transferring the holes through the first common layer to the light emitting layer under the action of an electric field between the anode and the cathode, the electrons being transmitted through the second common layer to the light emitting layer, the holes and electrons recombine and then emit light within the light emitting layer. The OLED display panel is usually by the R, G, B three primary colors to achieve a different color of the display, so OLED display panel of a pixel usually contains R, G, B three light-emitting unit, normally, each of the three R, G, and B light emitting units can be individually controlled by the driving circuit, specifically, the cathode layers of the three light-emitting units of R, G, and B are common, and the anodes are independent from each other, by controlling the anode corresponding to each light-emitting unit, a separate driving of each light-emitting unit can be realized.

With the improvement of the display panel resolution, the number of light emitting units per unit area is also increasing, resulting in the distance between the light emitting units continue to decrease, R, G, B three light-emitting unit of the light-emitting layer of different materials, the bright voltage is also different. In the structure of the conventional OLED display panel as described above, since the first common layer of the adjacent light emitting cells communicates and the distance between the light emitting units is small in order to improve the resolution, when one of the light emitting cells (target light emitting cells) is lit, a small amount of holes can be injected into the adjacent light emitting cells through the first common layer, recombined with the electrons in the adjacent light emitting cells, which led to the luminous impure of the target light-emitting unit, this phenomenon known as the leakage of light-emitting phenomenon, a small amount of leakage generated by the leakage current leakage current.

When the target light-emitting unit is lit at a high current, a small amount of holes can cause the adjacent light-emitting cells to emit light, but the brightness is relatively weak, will be the target light-emitting unit issued by the strong light cover, the human eye can not identify, at this time the effect of light leakage is small. However, when the target light emitting unit is lit at a low current, the light emitted by the target light emitting unit is weak, and the performance of the light leakage phenomenon is relatively obvious, thereby reducing the display effect of the OLED display panel.

SUMMARY OF THE DISCLOSURE

In view of the deficiencies of the prior art, the present disclosure provides an OLED display panel and a method for manufacturing the OLED display panel which can effectively eliminate the light leakage phenomenon between adjacent two sub-pixels and improve the display quality of the OLED display panel.

In order to achieve the above object, the present disclosure adopts the following technical scheme:

An OLED display panel includes a TFT array substrate and a plurality of anodes array arranged on the TFT array substrate, wherein, a pixel defining layer is covered on the TFT array substrate, the pixel defining layer includes an opening for exposing the anode and a spacer for spacing two adjacent ones of the anodes, a groove having an upper opening is arranged in the spacer, each of the openings corresponds to a sub-pixel area; wherein, a first common layer, a second common layer and a cathode layer are sequentially arranged on the pixel defining layer, the first common layer, the second common layer and the cathode layer are arranged with a light emitting material unit corresponding to each sub-pixel area; the first common layer, the second common layer and the cathode layer have a gap at a position corresponding to the groove, so that the first common layer, the second common layer and the cathode layer are cut off between adjacent two sub-pixel areas.

Wherein, the width of the upper opening of the groove is 2 μm or more.

Wherein, the depth of the groove being greater than the total thickness of the first common layer, the second common layer and the cathode layer.

Wherein, the groove having a trapezoidal cross-section and the width of the upper opening of the groove being less than the width of the bottom surface.

Wherein, the material of the pixel defining layer is a non-conductive organic material of an inorganic material.

Wherein, each sub-pixel area respectively corresponds to a red sub-pixel, a green sub-pixel or a blue sub-pixel, the light emitting material unit in the red sub-pixel is a light emitting material unit capable of emitting red light, the light emitting material unit in the green sub-pixel is a light emitting material unit capable of emitting green light, and the light emitting material unit in the blue sub-pixel is a light emitting material unit capable of emitting blue light.

Wherein, the first common layer includes a hole injecting layer and a hole transporting layer provided in this order in a direction away from the anode, the second common layer includes an electron injecting layer and an electron transporting layer provided in this order in a direction away from the cathode layer.

The present disclosure also provides a method for producing an OLED display panel as described above, including: providing a TFT array substrate and preparing an array of a plurality of anodes on the TFT array substrate; preparing a pixel defining layer thin film on the TFT array substrate; applying an etching process to etch the pixel defining layer thin film to form a pixel defining layer having an opening and a spacer and forming a groove in the spacer; depositing a first common layer, a light emitting material unit, a second common layer, and a cathode layer on the pixel defining layer in this order; wherein, the first common layer, the second common layer, and the cathode layer are deposited at a position corresponding to the groove, and the first common layer, the second common layer, and the cathode layer are formed a gap at a position corresponding to the groove.

Wherein, applying a vacuum deposition process to sequentially deposit the first common layer, the light emitting material unit, the second common layer and the cathode layer on the pixel defining layer.

Another aspect of the present disclosure is to provide a display device including a driving unit and a OLED display panel as described above, the driving unit providing a driving signal to the OLED display panel to cause the OLED display panel to display a screen.

Compared with the prior art, the OLED display panel and the manufacturing method thereof according to the embodiment of the disclosure, in the OLED display panel, there are gaps between adjacent two sub-pixel areas, reducing the leakage of holes between adjacent two sub-pixel areas, it is possible to effectively eliminate the light leakage phenomenon between two adjacent sub-pixels and improve the display quality of the OLED display panel.

DETAILED DESCRIPTION OF PREFERRED EMBODIMENTS

Figure 1:
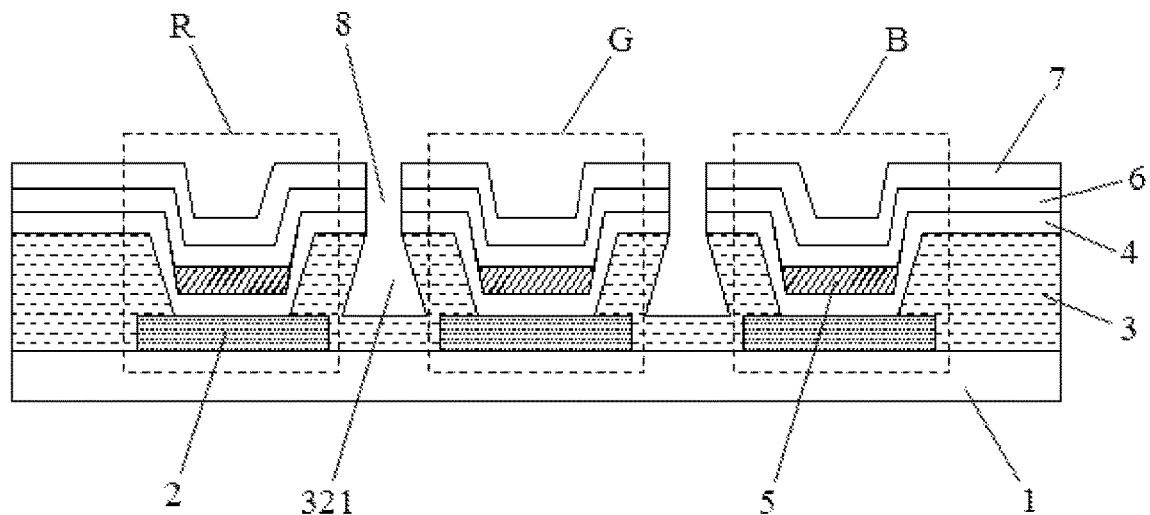
FIG. 1 is a schematic structural view of an OLED display panel according to an embodiment of the present disclosure.

For the purposes, technical solutions, and advantages of the present disclosure will become more apparent below with reference to the specific embodiments of the present disclosure will be described in detail. Examples of such preferred embodiments have been illustrated in the accompanying drawings. As shown in the drawings according to an embodiment of the present disclosure and the accompanying drawings described are only exemplary, and the present disclosure is not limited to these embodiments.

Here, it should be noted that, in order to avoid unnecessary detail obscure the present disclosure, in the drawings only shows a structure and/or processing steps according to the present disclosure are closely related, and omitted other details of the present disclosure has little relationship.

The present embodiment first provides an OLED display panel, as shown in FIG. 1, the OLED display panel includes a TFT array substrate 1 and a plurality of functional layers provided in succession on the TFT array substrate 1, these functional layers include an anode layer (including a plurality of anodes 2 arranged in an array), a pixel defining layer 3, a first common layer 4, an emissive layer (EML, as shown in FIG. 1, which corresponds to a light emitting material unit 5 located above each of the anodes 2), a second common layer 6 and a cathode layer 7.

Figure 2:
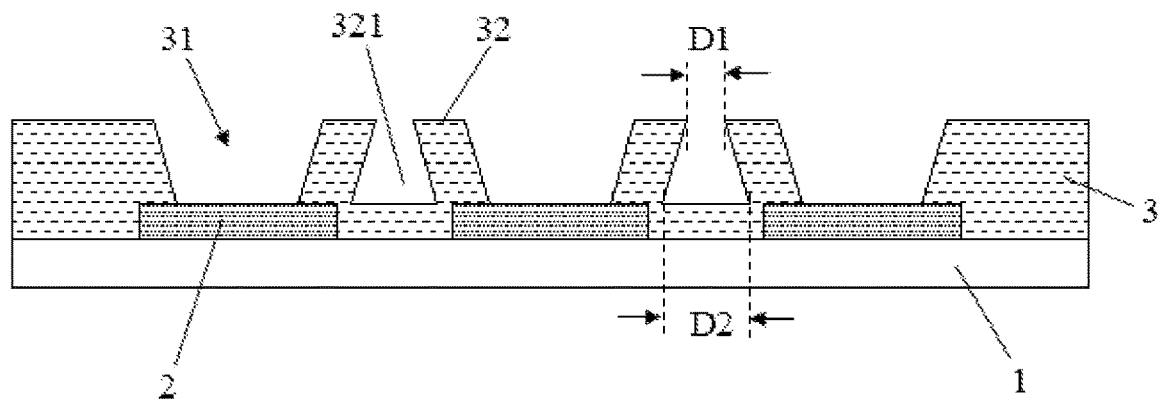
FIG. 2 is a schematic structural view of a pixel defining layer on a TFT array substrate in an embodiment of the present disclosure.
Figure 3:
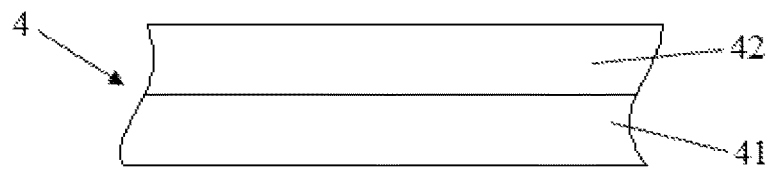
FIG. 3 is a schematic structural view of a first common layer in an embodiment of the present disclosure.

Wherein, please refer to FIG. 1 and FIG. 2, the pixel defining layer 3 is covered on the TFT array substrate, the pixel defining layer 3 includes an opening 31 for exposing the anode 2 and a spacer 32 for spacing two adjacent ones of the anodes 2, a groove 321 having an upper opening is arranged in the spacer 32, each of the openings 31 corresponds to a sub-pixel area R, G, B. The first common layer 4, the second common layer 6 and the cathode layer 7 have a gap 8 at a position corresponding to the groove 321, so that the first common layer 4, the second common layer 6 and the cathode layer 7 are cut off between adjacent two sub-pixel areas (such as between the sub-pixel areas R and G). Thus, since there is a gap between adjacent two sub-pixels, the first common layer is cut off, which reduces the leakage of holes between adjacent two sub-pixel areas, it is possible to effectively eliminate the light leakage phenomenon between two adjacent sub-pixel areas and improve the display quality of the OLED display panel.

Wherein, as shown in FIG. 2, the width D1 of the upper opening of the groove 321 is preferably 2 μm or more in order to better prevent the holes from leaking from each other between adjacent two sub-pixel areas. Further, in the present embodiment, the groove 321 has a trapezoidal cross section, and the width D1 of the upper opening of the groove 321 is smaller than the width D2 of the bottom surface.

Wherein the depth of the groove 321 is set to be larger than the total thickness of the first common layer 4, the second common layer 6, and the cathode layer 7. Thus, during the process of depositing the first common layer 4, the second common layer 6 and the cathode layer 7, the first common layer 4, the second common layer 6, and the cathode layer 7 corresponding to the position of the groove 321 can be completely dropped into the groove 321, so that the first common layer 4 can be better cut off to better prevent the holes from leaking from each other between adjacent two sub-pixel areas.

Figure 4:
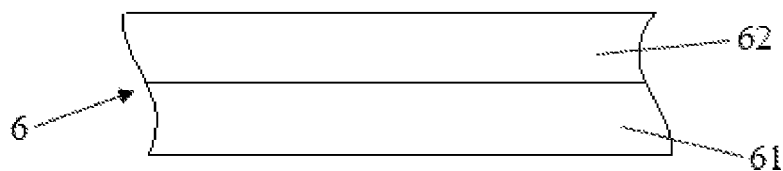
FIG. 4 is a schematic structural view of a second common layer in an embodiment of the present disclosure.
Figure 5:
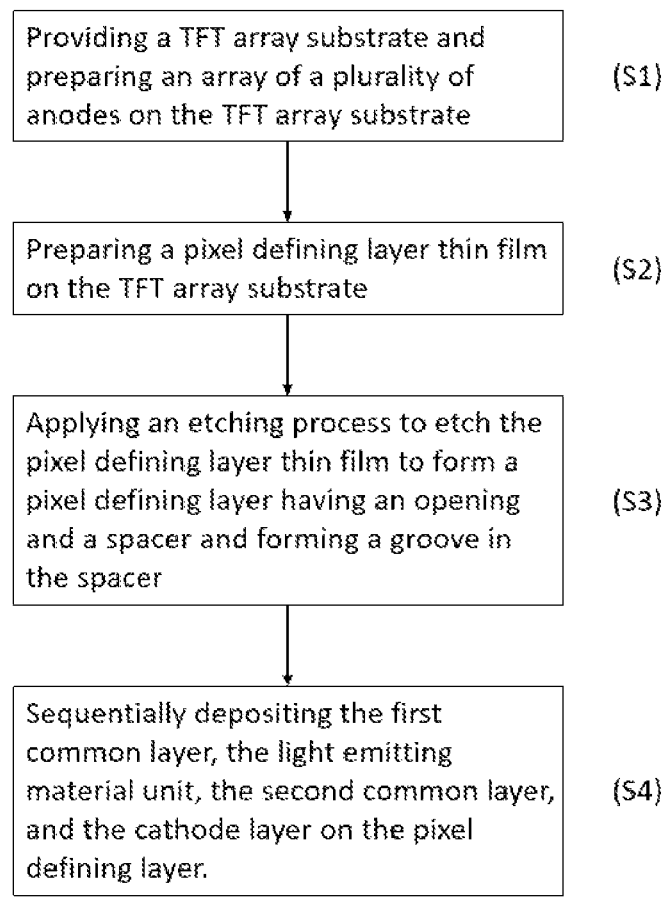
FIG. 5 is a process flow diagram of a method for preparing an OLED display panel according to an embodiment of the present disclosure.

Specifically, in the OLED display panel, as shown in FIG. 1, each of the sub-pixel areas corresponds to the red sub-pixel R, the green sub-pixel G, or the blue sub-pixel B, and the red sub-pixel R, the green sub-pixel G, and the blue sub-pixel B are sequentially arranged as one pixel unit. Wherein, the light emitting material unit 5 in the red sub-pixel R is a light emitting material unit emitting red light, the light emitting material unit 5 in the green sub-pixel G is a light emitting material unit emitting green light, and the light emitting material unit 5 in the blue sub-pixel B is a light emitting material unit emitting blue light. Each pixel unit is a mixture of R, G, and B primary colors emitted from the red sub-pixel R, the green sub-pixel G, and the blue sub-pixel B to realize the display of different colors.

Wherein the first common layer 4 and the second common layer 6 may be composed of a material layer or a two or more material layer. Specifically, in the present embodiment, as shown in FIG. 4, The first common layer 4 includes a hole injection layer 41 and a hole transport layer 42, and the hole injection layer 41 and the hole transport layer 42 are stacked in this order in a direction away from the anode 2, the hole injection layer 41 and the hole transport layer 42 have similar functions and can be collectively referred to as a Hole Transport Layer (HTL). As shown in FIG. 5, the second common layer 6 includes an electron injecting layer 61 and an electron transporting layer 62, the electron injecting layer 61 and the electron transporting layer 62 are sequentially stacked in a direction away from the cathode layer 7, The electron injection layer 61 and the electron transport layer 62 have similar functions and can be collectively referred to as an Electron Transport Layer (ETL).

Figure 6:
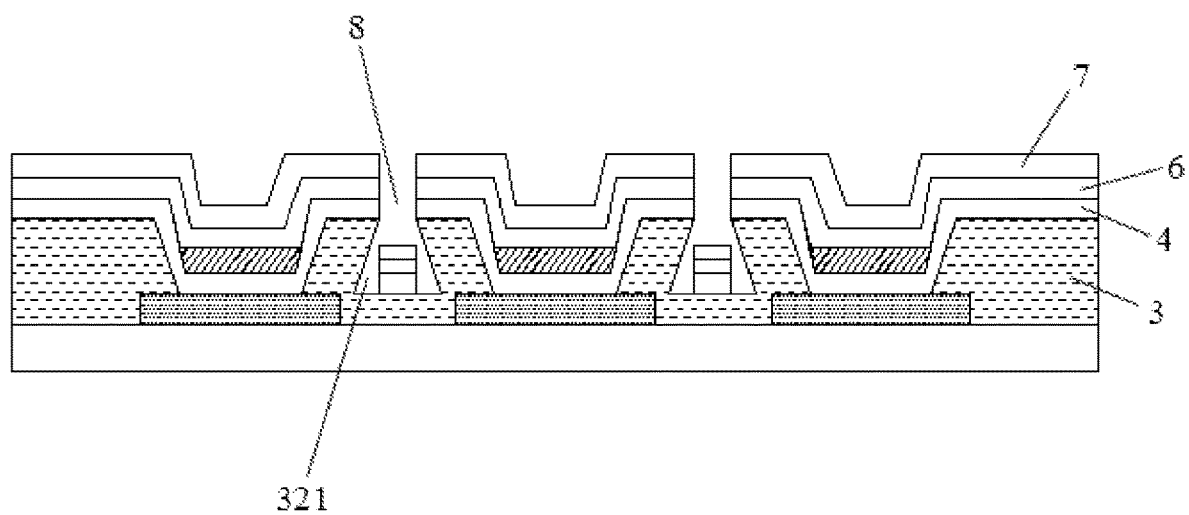
FIG. 6 is an exemplary illustration of the device structure obtained after depositing the first common layer, the second common layer, and the cathode layer in the manufacturing method provided by the embodiment of the present disclosure.

The following describes the manufacturing method of the OLED display panel described in the figure, as shown in FIG. 6, which includes the steps of:

S1, providing a TFT array substrate 1 and preparing an array of a plurality of anodes 3 on the TFT array substrate 1.

S2, preparing a pixel defining layer thin film on the TFT array substrate 1. The pixel defining layer film continuously covers the TFT array substrate 1 and the plurality of anodes 2 on the TFT array substrate. The pixel defining layer film is prepared using a non-conductive material, which may be a non-conductive organic material or an inorganic material.

S3, applying an etching process to etch the pixel defining layer thin film to form a pixel defining layer having an opening 31 and a spacer 32 and forming a groove 321 in the spacer 32. Wherein, an opening 31 is provided corresponding to each of the anodes 2, the anode 2 is exposed from the opening 31; the spacers 32 are for spacing two adjacent ones of the two.

S4, sequentially depositing the first common layer 4, the light emitting material unit 5, the second common layer 6, and the cathode layer 7 on the pixel defining layer 3. Wherein, refer to FIG. 7, the first common layer 4, the second common layer 6, and the cathode layer 7 are deposited in the groove 321 at a position corresponding to the groove 321, thus, the first common layer 4, the second common layer 6, and the cathode layer 7 form a gap 8 at positions corresponding to the grooves 321, respectively. Specifically, the first common layer 4, the light emitting material layer 5, the second common layer 6, and the cathode layer 7 may be sequentially deposited on the pixel defining layer 3 by a vacuum deposition process. It should be noted, the portions of the first common layer 4, the second common layer 6, and the cathode layer 7 deposited in the groove 321 may be retained directly within the groove 321 or may be removed by some other process. In other embodiments, the gap 8 and the groove 321 may also be filled with an insulating material.

Figure 7:
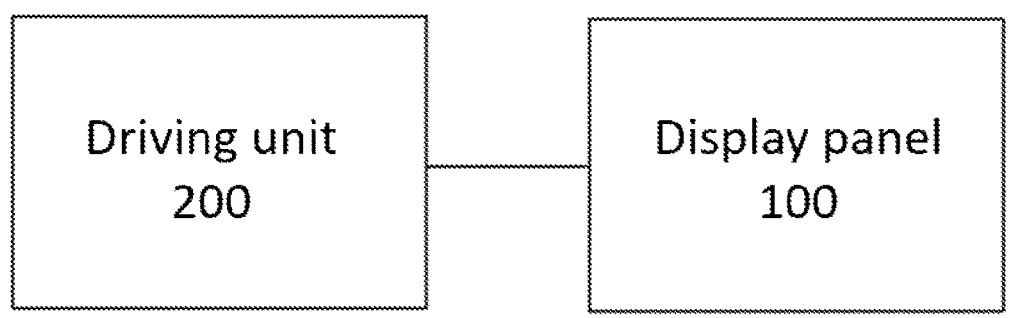
FIG. 7 is a schematic structural view of a display device according to an embodiment of the present disclosure.

The present embodiment also provides a display device, as shown in FIG. 7, the display device includes a drive unit 200 and a display panel 100 that provides drive signals to the display panel 100 to cause the display panel 100 to display a screen. Wherein the display panel 100 employs the OLED display panel of the present disclosure as provided in the above embodiment.

It is noted that, as used herein, relational terms such as first and second, and the like are merely used to distinguish one entity or another entity operation or operations separate, and do not necessarily require or imply that these entities the actual existence of any such relationship or order between or operations. Moreover, the term "comprising", "including" or any other variation thereof are intended to cover a non-exclusive inclusion, such that a series of factors including the process, method, article, or apparatus includes not only those elements, but also not explicitly listed the other elements, or further comprising for such process, method, article or device inherent feature. Without more constraints, by the statement "includes a . . . " as defined in the elements, it does not exclude the existence of additional identical elements including the element process, method, article, or apparatus.

The above description is only a specific embodiment of the present application, it should be noted that those of ordinary skill in the art, in the present application without departing from the principles of the premise, but also a number of improvements and modifications can be made, these improvements and modifications are to be considered the scope of the present application.

What is claimed is:

1. An OLED display panel comprises a TFT array substrate and a plurality of anodes array arranged on the TFT array substrate, wherein, a pixel defining layer is covered on the TFT array substrate, the pixel defining layer comprises an opening corresponding to and exposing each of the anodes and a spacer located between and spacing two adjacent ones of the anodes, a groove having an upper opening is arranged in the spacer, each of the openings corresponds to a sub-pixel area; wherein, a first common layer, a second common layer and a cathode layer are sequentially arranged on the pixel defining layer so that the second common layer is arranged on the first common layer and the cathode layer is arranged on the second common layer, the first common layer, the second common layer and the cathode layer are arranged with a light emitting material unit corresponding to each sub-pixel area;

the first common layer, the second common layer and the cathode layer have a gap at a position corresponding to the groove, so that the first common layer, the second common layer and the cathode layer are cut off between adjacent two sub-pixel areas;

wherein the groove is located between two adjacent ones of the sub-pixel areas and has a trapezoidal cross-section and a width of the upper opening of the groove is less than a width of a bottom surface of the groove, such that portions the first common layer, the second common layer, and the cathode layer that are arranged on the upper opening of the groove are caused to break at the position corresponding to the groove and between the two adjacent ones of sub-pixel areas by the groove to form the gap of the first common layer, the second common layer, and the cathode layer.

2. The OLED display panel corresponding to claim 1, wherein, the width of the upper opening of the groove is 2 μm or more.

3. The OLED display panel corresponding to claim 1, wherein, the depth of the groove being greater than the total thickness of the first common layer, the second common layer and the cathode layer.

4. The OLED display panel corresponding to claim 1, wherein, the material of the pixel defining layer is a non-conductive organic material of an inorganic material.

5. The OLED display panel corresponding to claim 1, wherein, each sub-pixel area respectively corresponds to a red sub-pixel, a green sub-pixel or a blue sub-pixel, the light emitting material unit in the red sub-pixel is a light emitting material unit capable of emitting red light, the light emitting material unit in the green sub-pixel is a light emitting material unit capable of emitting green light, and the light emitting material unit in the blue sub-pixel is a light emitting material unit capable of emitting blue light.

6. The OLED display panel corresponding to claim 1, wherein, the first common layer comprises a hole injecting layer and a hole transporting layer provided in this order in a direction away from the anode, the second common layer comprises an electron injecting layer and an electron transporting layer provided in this order in a direction away from the cathode layer.

7. A method of preparing an OLED display panel, comprising:
   providing a TFT array substrate and preparing an array of a plurality of anodes on the TFT array substrate;
   preparing a pixel defining layer thin film on the TFT array substrate;
   applying an etching process to etch the pixel defining layer thin film to form a pixel defining layer having an opening corresponding to and exposing each of the anodes and a spacer located between and spacing two adjacent ones of the anodes; and forming a groove having an upper opening in the spacer;
   depositing a first common layer, a light emitting material unit, a second common layer, and a cathode layer on the pixel defining layer in this order so that the second common layer is arranged on the first common layer and the cathode layer is arranged on the second common layer; wherein, the first common layer, the second common layer, and the cathode layer are deposited at a position corresponding to the groove, and the first common layer, the second common layer, and the cathode layer are formed a gap at a position corresponding to the groove;
   wherein the groove is located between two adjacent ones of the sub-pixel areas and has a trapezoidal cross-section and a width of the upper opening of the groove is less than a width of a bottom surface of the groove, such that portions the first common layer, the second common layer, and the cathode layer that are arranged on the upper opening of the groove are caused to break at the position corresponding to the groove and between the two adjacent ones of sub-pixel areas by the groove to form the gap of the first common layer, the second common layer, and the cathode layer.

8. The method of preparing an OLED display panel according to claim 7, wherein, applying a vacuum deposition process to sequentially deposit the first common layer, the light emitting material unit, the second common layer and the cathode layer on the pixel defining layer.

9. The method of preparing an OLED display panel according to claim 7, wherein, the width of the upper opening of the groove is 2 µm or more.

10. The method of preparing an OLED display panel according to claim 7, wherein, the depth of the groove being greater than the total thickness of the first common layer, the second common layer and the cathode layer.

11. The method of preparing an OLED display panel according to claim 7, wherein, the material of the pixel defining layer is a non-conductive organic material of an inorganic material.

12. A display device comprises a driving unit and an OLED display panel, the driving unit provides a driving signal to the OLED display panel so that the OLED display panel display screen; wherein, the OLED display panel comprises a TFT array substrate and a plurality of anodes array arranged on the TFT array substrate, a pixel defining layer is covered on the TFT array substrate, the pixel defining layer comprises an opening located between and exposing each of the anodes and a spacer located between and spacing two adjacent ones of the anodes, a groove having an upper opening is arranged in the spacer, each of the openings corresponds to a sub-pixel area; wherein,
   a first common layer, a second common layer and a cathode layer are sequentially arranged on the pixel defining layer so that the second common layer is arranged on the first common layer and the cathode layer is arranged on the second common layer, the first common layer, the second common layer and the cathode layer are arranged with a light emitting material unit corresponding to each sub-pixel area;
   the first common layer, the second common layer and the cathode layer have a gap at a position corresponding to the groove, so that the first common layer, the second common layer and the cathode layer are cut off between adjacent two sub-pixel areas;
   wherein the groove is located between two adjacent ones of the sub-pixel areas and has a trapezoidal cross-section and a width of the upper opening of the groove is less than a width of a bottom surface of the groove, such that portions the first common layer, the second common layer, and the cathode layer that are arranged on the upper opening of the groove are caused to break at the position corresponding to the groove and between the two adjacent ones of sub-pixel areas by the groove to form the gap of the first common layer, the second common layer, and the cathode layer.

13. The display device according to claim 12, wherein, the width of the upper opening of the groove is 2 µm or more.

14. The display device according to claim 12, wherein, the depth of the groove being greater than the total thickness of the first common layer, the second common layer and the cathode layer.

15. The display device according to claim 12, wherein, the material of the pixel defining layer is a non-conductive organic material of an inorganic material.

16. The display device according to claim 12, wherein, each sub-pixel area respectively corresponds to a red sub-pixel, a green sub-pixel or a blue sub-pixel, the light emitting material unit in the red sub-pixel is a light emitting material unit capable of emitting red light, the light emitting material unit in the green sub-pixel is a light emitting material unit capable of emitting green light, and the light emitting material unit in the blue sub-pixel is a light emitting material unit capable of emitting blue light.

17. The display device according to claim 12, wherein, the first common layer comprises a hole injecting layer and a hole transporting layer provided in this order in a direction away from the anode, the second common layer comprises an electron injecting layer and an electron transporting layer provided in this order in a direction away from the cathode layer.

* * * * *